(12) United States Patent
Slurink et al.

(10) Patent No.: US 10,955,454 B2
(45) Date of Patent: Mar. 23, 2021

(54) TESTING APPARATUS AND TESTING METHOD OF VAPORIZERS OF ELECTRONIC CIGARETTES

(71) Applicant: Sluis Cigar Machinery B.V., Kampen (NL)

(72) Inventors: Oscar Slurink, Heino (NL); Lambert Wijnand Breman, Kampen (NL); Mark Leendert Meijer, Zwolle (NL); Abraham Van Den Berg, Ijsselmuiden (NL)

(73) Assignee: Sluis Cigar Machinery B.V., Kampen (NL)

( * ) Notice: Subject to any disclaimer, the term of this patent is extended or adjusted under 35 U.S.C. 154(b) by 370 days.

(21) Appl. No.: 15/574,081

(22) PCT Filed: Jun. 1, 2016

(86) PCT No.: PCT/NL2016/050391
§ 371 (c)(1),
(2) Date: Nov. 14, 2017

(87) PCT Pub. No.: WO2016/200252
PCT Pub. Date: Dec. 15, 2016

(65) Prior Publication Data
US 2018/0299501 A1 Oct. 18, 2018

(30) Foreign Application Priority Data

Jun. 9, 2015 (NL) ........................... 2014943

(51) Int. Cl.
*G01R 31/01* (2020.01)
*A24F 47/00* (2020.01)
*A24C 5/34* (2006.01)

(52) U.S. Cl.
CPC ............ *G01R 31/01* (2013.01); *A24C 5/3406* (2013.01); *A24F 47/008* (2013.01)

(58) Field of Classification Search
CPC ...... A24C 5/3406; G01R 31/01; A24F 47/008
See application file for complete search history.

(56) References Cited

U.S. PATENT DOCUMENTS

| 3,750,878 A | 8/1973 | Atchley et al. |
| 5,673,799 A * | 10/1997 | Braden ................ G01R 31/016 209/574 |

(Continued)

FOREIGN PATENT DOCUMENTS

| CN | 202744313 U | 2/2013 |
| CN | 203941232 U * | 11/2014 |

(Continued)

OTHER PUBLICATIONS

International Search Report and Written Opinion dated Oct. 18, 2016 for Application No. PCT/NL2016/050391.

(Continued)

*Primary Examiner* — Lee E Rodak
*Assistant Examiner* — Brent J Andrews
(74) *Attorney, Agent, or Firm* — Patterson + Sheridan, LLP (57) ABSTRACT

An apparatus for testing vaporizers of electronic cigarettes is disclosed. Each vaporizer comprises a heating element, and electric terminals for electrically powering the heating element. The testing apparatus comprises a holding construction part with multiple movable vaporizer holding units. A contact construction part is provided with multiple electric contact members each associated with a respective holding unit, and electrically contacting at least one electric terminal of a vaporizer in the associated holding unit. A supply construction part conducts electric power to each contact (Continued)

member. A measuring part measures at least one electric quantity representative of an electric resistance and/or inductance of the heating element, compares the measured quantity with a pre determined range and, if the measured quantity is outside the range, outputs a rejection signal.

17 Claims, 8 Drawing Sheets

(56) References Cited

U.S. PATENT DOCUMENTS

| | | | |
|---|---|---|---|
| 6,246,251 B1 * | 6/2001 | Gallagher | G01R 31/2851 |
| | | | 209/573 |
| 2011/0265806 A1 * | 11/2011 | Alarcon | A24F 47/00 |
| | | | 131/273 |
| 2014/0261414 A1 * | 9/2014 | Weitzel | A61M 15/002 |
| | | | 128/203.14 |
| 2014/0334804 A1 | 11/2014 | Choi | |

FOREIGN PATENT DOCUMENTS

| | | |
|---|---|---|
| CN | 203941232 U | 11/2014 |
| WO | 2015022448 | 2/2015 |

OTHER PUBLICATIONS

Search Report and Written Opinion dated Feb. 12, 2016 for Netherland Application No. NL2014943.
European communication pursuant to Rule 114(2) EPC dated Nov. 21, 2018, corresponding to Application No. 16744896.8.

* cited by examiner

TESTING APPARATUS AND TESTING METHOD OF VAPORIZERS OF ELECTRONIC CIGARETTES

FIELD OF THE INVENTION

The invention relates to the field of testing of electronic cigarettes, and more specifically to testing of vaporizers of electronic cigarettes to assess their performance.

BACKGROUND OF THE INVENTION

A vaporizer of an electronic cigarette comprises a liquid holder forming a chamber with a filler material retaining a liquid to be vaporized, a heating element, electric terminals connected to the heating element for electrically powering the heating element, and a vapour output, whereby the vaporizer is to generate vapour emerging from the vapour output when a current flows through the electric terminals in the heating element. In operation, in the electronic cigarette an air flow is detected, generated by a user drawing in air through the electronic cigarette. The detection of the flow triggers a supply of electrical power from a battery to the electric terminals of the heating element, which as a consequence heats up and causes part of the liquid in the vaporizer to vaporize. The vapour emerging from the vapour output of the vaporizer then mixes with the air drawn in by the user.

Since this vaporizing effect is crucial in the functioning of an electronic cigarette, in the manufacture of the electronic cigarette quality needs to be assured in that a proper functioning of the vaporizer is to be verified in a test. If the test shows that the vaporizer malfunctions, then the vaporizer, possibly an assembly including the vaporizer, is to be rejected and removed from a production line for discarding or analysis of the defect.

With the required high production rate in electronic cigarette manufacturing industry, a proper test should be performed automatically, without human intervention, in particular without manual intervention.

Thus, a need exists to provide an apparatus and method to satisfy such requirement.

SUMMARY OF THE INVENTION

It would be desirable to provide an improved, or at least alternative apparatus and method for testing vaporizers of electronic cigarettes. It would also be desirable to provide such apparatus and method allowing a continuous testing of vaporizers of electronic cigarettes. It would further be desirable to provide such apparatus having a simple construction requiring a low number of parts. It would also be desirable to provide such apparatus and method which produce a reliable result.

To better address one or more of these concerns, in a first aspect of the invention a testing apparatus for testing vaporizers of electronic cigarettes is provided. Each vaporizer comprises a heating element, and electric terminals connected to the heating element for electrically powering the heating element. The testing apparatus comprises: a holding construction part provided with multiple holding units each for holding a vaporizer, wherein the holding construction part is movable whereby the holding units are moved along a holding unit trajectory; a contact construction part provided with multiple electrical contact members, wherein each contact member is associated with a respective holding unit, and is configured to electrically contact at least one electric terminal of a vaporizer in the associated holding unit; a supply construction part configured to conduct electric power to each contact member; and a measuring part configured to measure at least one electric quantity representative of an electric resistance and/or inductance of the heating element.

The heating element is manufactured from electrically resistive material in order to produce heat for a liquid in the vaporizer to vaporize, when electric power is supplied to the heating element. The heating element may take different forms. In an embodiment, the heating element comprises a wire. The wire may be wound to a coil or spiral. The wire may comprise an electrically isolating coating. The wire may be mounted on a mandrel. The heating element may comprise different wires electrically connected in series or in parallel.

The heating element may, additionally or alternatively, comprise a strip. The strip may be wound to a coil or spiral. The strip may comprise an electrically isolating coating. The strip may be mounted on a mandrel. The heating element may comprise different wires electrically connected in series or in parallel.

Here, the electric resistance is measured in ohm, and the inductance is measured in henry.

With the testing apparatus, vaporizers of electronic cigarettes can be tested, in particular on the proper configuration and functioning of the heating element. With a proper configuration and functioning of the heating element, it can be expected with a high degree of certainty that the vaporizer will be able to produce an amount of vapour when the vaporizer is electrically powered.

Furthermore, a vaporizer being part of an assembly of a vaporizer and another part of an electronic cigarette can be tested with the testing apparatus, and even a vaporizer being part of an essentially complete electronic cigarette can be tested with the testing apparatus, provided that the electric terminals connected to the heating element are available, and are not bridged, apart by the heating element itself, by another electric circuit or circuit element, unless the electric properties of the bridging element are known and can be taken into account when performing the testing.

It is noted that the vaporizer to be tested preferably at least should comprise the heating element, and the electric terminals connected to the heating element. Other elements which normally are part of a vaporizer, such as a filler material to retain a liquid to be vaporized, need not (yet) be part of the vaporizer to still allow the testing apparatus to perform the testing as disclosed. On the other hand, if said other elements, such as the filler material, or the filler material and the liquid to be vaporized, are present in the vaporizer while the electric terminals of the heating element are available for testing, then still the testing apparatus can perform the test as disclosed. In other words, the testing apparatus can be disposed in different stages of assembly of the vaporizer, as long as the heating element and the electric terminals have been provided on or in the vaporizer.

In the testing apparatus, the vaporizers are mechanically conveyed in a movable holding construction part which has multiple holding units which each are configured to hold one vaporizer in a predetermined position and orientation, to provide a high degree of predictability of a spatial position and orientation in time for each vaporizer. This facilitates an automatic performance of a test, which requires contacting the vaporizer with external structures.

A holding unit can be configured in different forms. As an example, a holding unit may comprise a resilient material having a recess for accommodating a vaporizer by friction through a clamping force exerted by the resilient material as it is deformed by the vaporizer. Alternatively, the holding unit may be made from a rigid material having a recess for accommodating a vaporizer by friction through a clamping force exerted on the vaporizer as the latter is deformed. As another example, a holding unit may comprise a gripper having gripper parts engaging a vaporizer.

The holding construction part comprises the holding units which are moved or conveyed along a holding unit trajectory. The holding construction part can have different configurations. A configuration of the holding construction part may depend on the holding unit trajectory. As an example, when the holding unit trajectory is a straight trajectory, the holding construction part may comprise a belt or the like provided with the holding units. The belt may be running around two or more rollers such that between two rollers a part of the belt follows a straight trajectory. As another example, when the holding unit trajectory is a curved trajectory, the holding construction part may comprise a belt or the like provided with the holding units, the belt running around two or more rollers. Between two rollers, the belt may be guided along a curved guide such that between the two rollers the belt follows a curved trajectory. As a further preferred example, the holding unit trajectory may be circular, wherein the holding construction part may comprise a rotating body, such as a circular ring or plate, carrying the holding units and moving them in rotation along the holding unit trajectory.

In an embodiment of the testing apparatus according to the invention, the testing apparatus further comprises: a supply unit configured to place the vaporizers in the holding units of the holding construction part at a receiving location along the holding unit trajectory so that the vaporizers are transported along at least part of the holding unit trajectory; and a discharge unit configured to remove the vaporizers from the holding units at a discharge location along the holding unit trajectory. The discharge location is downstream of the receiving location along the holding unit trajectory.

A movement of the holding construction part may be at a constant speed or at a variable speed. The variable speed may vary between zero speed and a maximum speed. The movement may be intermittent. The speed may be adjustable, e.g. depending on a specific vaporizer to be tested and/or depending on the position of the vaporizer along the holding unit trajectory.

In the testing apparatus of the present invention, the contact construction part is provided with multiple electric contact members. Each contact member may have one or more electric contacts to contact respective one or more electric terminals of a vaporizer, the electric terminals being connected to the heating element of the vaporizer. Each contact member is associated with a respective holding unit, and the contact member is configured to electrically contact the one or more electric terminals of a vaporizer in the associated holding unit.

A vaporizer may have an enclosure acting as one of the electric terminals of the heating element, and having an electrical mass connection with the testing apparatus when the vaporizer is held in the associated holding unit. Then, another electric terminal may be contacted by an electric contact of the contact member to electrically power the heating element when a voltage is applied, or a current is supplied, to the electric contact of the contact member in contact with the electric terminal of the vaporizer.

Alternatively, a vaporizer may have two or more dedicated electric terminals, electrically isolated from the enclosure of the vaporizer. Additionally, the enclosure may be made of an electrically isolating material. The electric terminals of the vaporizer may be contacted by corresponding electric contacts of the contact member to electrically power the heating element when a voltage is applied, or a current is supplied, to the electric contacts of the contact member in contact with the electric terminals of the vaporizer.

Electric power may be conducted to each contact member of the contact construction part by a supply construction part. The supply construction part provides electric connections between a power supply and each contact member, in particular when the contact construction part moves in synchronism with the holding construction part and the power supply is stationary, but not limited thereto, since in some embodiments the power supply may also be fixed to the supply construction part, and moving therewith.

The measuring part of the testing apparatus is configured to measure at least one electric quantity representative of an electric resistance and/or inductance of the heating element of the vaporizer. The at least one electric quantity may be a voltage (at a predetermined current), or a current (at a predetermined voltage), or a combination of a voltage and a current (when both are not predetermined), or a frequency of a voltage and/or a current in case of AC, or a phase shift between a voltage and a current in case of AC, or a time constant of a voltage or current in case of DC, such that when the at least one electric quantity is measured, the electric resistance and/or inductance of the heating element can be determined at the measuring part configured to receive the electric quantity and convert the at least one electric quantity into a resistance and/or inductance, or at least a value representative of the resistance and/or inductance. Accordingly, in an embodiment of the testing apparatus of the present invention, the measuring part is configured for: measuring a DC current flowing through the heating element while applying a predetermined DC voltage to the electric terminals of the heating element, or measuring a DC voltage at the electric terminals of the heating element while supplying a predetermined DC current flowing through the heating element, or measuring a DC voltage at the electric terminals of the heating element and measuring a DC current flowing through the heating element, or measuring an AC current flowing through the heating element while applying a predetermined AC voltage to the electric terminals of the heating element, or measuring an AC voltage at the electric terminals of the heating element while supplying a predetermined AC current flowing through the heating element, or measuring an AC voltage at the electric terminals of the heating element and measuring an AC current flowing through the heating element, to determine electric resistance. In case of AC voltage or AC current, the measuring part may further be configured to measure the electric frequency of the AC voltage or the AC current, to determine electric inductance or electric impedance. In case of AC voltage and AC current, the measuring part may further be configured to measure the electric phase shift between the AC voltage and AC current, to determine electric inductance or electric impedance. In case of DC voltage or DC current, the measuring part may further be configured to measure an electric time constant of the DC voltage or DC current, to determine electric inductance and/or electric impedance.

In an embodiment of the testing apparatus of the invention, the measuring part further is configured to compare the measured quantity with a predetermined range and, if the measured quantity is outside the range, output a rejection signal.

It is noted that due to production variations in the heating element manufacturing process, production variations in the electric connections between the heating element and its electric terminals, and other factors, the electric resistance and/or inductance of the heating element, in particular the electric quantity associated with it as measured by the measuring part may vary in a range. Within this range, the heating element is considered to be of acceptable quality to function properly in the corresponding vaporizer, or in the electronic cigarette containing the vaporizer. Outside this range, the heating element is considered not to be of acceptable quality to function properly in the corresponding vaporizer, or in the electronic cigarette containing the vaporizer. In the latter case, the measuring part may output a rejection signal.

When a predetermined DC voltage is applied to the electric terminals of the heating element, and the heating element is intact and connected to the associated electric terminals, a DC current will flow in the heating element. Measuring the current provides a value representative of the electric resistance of the heating element, since according to Ohm's law, at a predetermined voltage, there is a direct relationship between the current flowing in the heating element and the resistance thereof. The higher the current, the lower the resistance, and the lower the current, the higher the resistance. If the current is higher than the predetermined range, this may e.g. indicate a short circuit in a part of the heating element, or even a bridging of the electric terminals by some unknown element or manufacturing error. If the current is lower than the predetermined range, this may e.g. indicate a relatively high transition resistance between one or more of the electric terminals and the heating element, or even an electric interruption between the electric terminals e.g. caused by a broken or non-existent connection between an electric terminal an the heating element, or a break in the heating element.

Similarly, when a predetermined DC current is supplied to the electric terminals of the heating element, and the heating element is intact and connected to the associated electric terminals, a DC voltage will be generated across the heating element. Measuring the voltage at the electric terminals provides a value representative of the electric resistance of the heating element, since according to Ohm's law, at a predetermined current, there is a direct relationship between the voltage across the electric terminals of the heating element, and the resistance thereof. The higher the voltage, the higher the resistance, and the lower the voltage, the lower the resistance. If the voltage is lower than the predetermined range, this may e.g. indicate a short circuit in a part of the heating element, or even a bridging of the electric terminals by some unknown element or manufacturing error. If the voltage is higher than the predetermined range, this may e.g. indicate a relatively high transition resistance between one or more of the electric terminals and the heating element, or even an electric near-interruption between the electric terminals e.g. caused by an almost broken connection between an electric terminal an the heating element, or an almost break in the heating element.

Similar considerations apply when instead of a DC voltage or a DC current, an AC voltage or an AC current are used for testing. In some cases, a DC or AC voltage applied to electric terminals of the vaporizer is not predetermined when measuring an associated DC or AC current, respectively. In other cases, a DC or AC current supplied to the electric terminals of the vaporizer is not predetermined when measuring an associated DC or AC voltage. In all of these cases, both voltage and current are to be measured, and both electric quantities taken together are representative of the electric resistance and/or inductance of the heating element.

When an inductive component should be measured, and AC voltage and AC current may be used in measuring the at least one electric quantity representative of the resistance, an electric frequency of the AC voltage or AC current may also be measured, in particular in case the frequency is not predetermined and/or not known, since the inductive component varies with varying frequency. Additionally or alternatively, a phase shift between the AC voltage and the AC current may be measured to obtain an indication of the inductive component of the heating element.

In case DC voltage and DC current are used in measuring the at least one electric quantity representative of the resistance and/or inductance, an electric time constant of the DC voltage or DC current may also be measured, since the resistive and inductive components determine this time constant.

For example, if the heating element comprises a wire being wound, an inductance may be measured to verify a desired spatial configuration of windings of the heating element having an inductance value being in a predetermined range.

The inductance can be measured as such, possibly before or after a measurement of a resistance of the heating element, or a combined measurement of resistance and inductance of the heating element can be made in the measuring part.

In an embodiment of the testing apparatus according to the present invention, the measuring part further is configured to actuate an ejection device if the rejection signal is issued, when the measured quantity is outside the predetermined range thereof. The ejection device is actuated to remove the vaporizer comprising the heating element concerned from the production process for lacking the required quality. The ejection device may be included in a discharge unit of the testing apparatus, or may be arranged further downstream in a discharge path of the vaporizers.

In an embodiment of the testing apparatus of the invention, the supply construction part comprises: multiple electric slip contacts, wherein each slip contact is associated with, and electrically connected to, a respective contact member, and wherein the supply construction part is adapted to be moved in synchronism with the contact construction part; and at least one power electric terminal configured to electrically contact and power slip contacts, wherein the slip contacts are adapted to move relative to the power electric terminal.

The use of slip contacts allows to provide electrical power from the power electric terminal to a contact member, and thereby to a heating element of a vaporizer held in a holding unit associated with the contact member, at an accurately mechanically predetermined time period, or within an accurately mechanically predetermined time period, to measure the at least one electric quantity representative of an electric resistance and/or inductance of the heating element.

In an embodiment of the testing apparatus of the invention, the power electric terminal is stationary, i.e. stationary relative to the movable holding construction part and contact construction part. A stationary power electric terminal may have a simple structure requiring little maintenance and replacement of worn parts.

The at least one power electric terminal may be used to supply a current or a predetermined current, or to apply a voltage or a predetermined voltage, to the contact member or contact members of the associated holding unit in the time period when the power electric terminal electrically contacts the at least one electric slip contact of the contact member. In the same time period, the electric terminals of the heating element of the vaporizer are in electric contact with the associated contact member. Thus, the time of application of a voltage or a current to the electric terminals of the heating element may be designed according to dimensions of the electric slip contact and speed of movement of the electric slip contact relative to the associated power electric terminal. The voltage may be applied, and the current may be supplied, by the measuring part, by a power supply being part of the measuring part, or by a separate power supply.

In an embodiment of the testing apparatus of the invention, each contact member is configured to be displaced between a first position in which the contact member electrically and mechanically contacts at least one electric terminal of a vaporizer in the associated holding unit, and a second position in which the contact member does not contact an electric terminal of the vaporizer in the associated holding unit.

It may be desired, e.g. to provide sufficient space for placing a vaporizer into a holding unit, to use contact members that are displaceable between different positions. In one of the positions, here referred to as the second position, an unimpeded path for placing a vaporizer into a holding unit is provided, but no contact between the contact member and at least one of the electric terminals of the heating element is established, whereas in the other one of the positions, here referred to as the first position, intended to be taken when the vaporizer is held in the holding unit, said path would be impeded, but a contact between the contact member and at least one of the electric terminals of the heating element is established.

In an embodiment of the testing apparatus of the invention, each contact member comprises a cam track follower, and upon movement of the contact construction part the contact members are positioned in and between the first position and the second position by a cam track engaging the cam track followers of the contact members, wherein the cam track followers are moved relative to the cam track while moving along a part of the cam track.

The cam track provides a simple and reliable structure to command a time and extent of movement of the contact members between the first and second positions thereof.

In an embodiment of the testing apparatus according to the invention, the cam track is stationary, i.e. stationary relative to the movable contact construction part. A stationary cam track may have a simple structure requiring little maintenance and replacement of worn parts.

In an embodiment of the testing apparatus according to the invention, the holding units form a circular configuration, and the holding construction part is movable in rotation whereby the holding units are moved in a rotation direction.

Accordingly, the vaporizers to be tested can be supplied to holding units of the holding construction part along the holding unit trajectory at a receiving location thereof, and subsequently are transported in a rotation direction along at least part of the holding unit trajectory to perform the testing. A rotating holding construction part can be structured relatively simple, and requires a simple drive, such as a rotating electrical motor, to be driven in rotation.

In an embodiment of the testing apparatus according to the invention, the contact construction part is fixed to the holding construction part to be moved therewith, in particular to be moved in rotation therewith.

In an embodiment of the testing apparatus according to the invention, the slip contacts are fixed to the holding construction part or the contact construction part to be moved therewith, in particular to be moved in rotation therewith.

In a second aspect, the present invention provides a method of testing vaporizers for electronic cigarettes, each vaporizer comprising a heating element, and electric terminals connected to the heating element for electrically powering the heating element. The method comprises the steps of: electrically powering the heating element; measuring at least one electric quantity representative of an electric resistance and/or inductance of the heating element; and comparing the measured quantity with a predetermined range and, if the measured quantity is outside the range, then rejecting the vaporizer.

As explained above, the step of electrically powering the (electric) terminals of the heating element can be performed by bringing the electric terminals of the heating element into contact with electrical contact members.

In an embodiment of the testing method of the invention, the measuring comprises: measuring a DC current flowing through the heating element while supplying a predetermined DC voltage to the electric terminals of the heating element, or measuring a DC voltage at the electric terminals of the heating element while supplying a predetermined DC current flowing through the heating element, or measuring a DC voltage at the electric terminals of the heating element and measuring a DC current flowing through the heating element, or measuring an AC current flowing through the heating element while supplying a predetermined AC voltage to the electric terminals of the heating element, or measuring an AC voltage at the electric terminals of the heating element while supplying a predetermined AC current flowing through the heating element, or measuring an AC voltage at the electric terminals of the heating element and measuring an AC current flowing through the heating element. The measuring may further comprise measuring the frequency of the AC voltage or the AC current.

These and other aspects of the invention will be more readily appreciated as the same becomes better understood by reference to the following detailed description and considered in connection with the accompanying drawings in which like reference symbols designate like parts.

DETAILED DESCRIPTION OF EMBODIMENTS

In the following, embodiments of (parts of) a testing apparatus according to the invention are described. The testing apparatus is constructed and arranged for testing vaporizers of electronic cigarettes. Also, an electronic cigarette or part thereof comprising the vaporizer can be tested in an embodiment of the testing apparatus according to the invention. Embodiments of the testing apparatus for testing a vaporizer as such, or a part of an electronic cigarette including a vaporizer but excluding an electrical power source (e.g. a battery), will be described.

As is well known by the person skilled in the art, each vaporizer comprises a heating element, and electric terminals connected to the heating element for electrically powering the heating element. In use of an electronic cigarette, a liquid to be vaporized is retained in a filler material in a chamber of the vaporizer, and the heating element is also located in said chamber. The vaporizer has a vapour output, whereby the vaporizer is to generate vapour emerging from the vapour output when a current flows through the electric terminals in the heating element. Air can flow through the vaporizer, such as through the chamber with the filler material, so that vapour generated in the vaporizer will be mixed with air at the vapour output.

The vaporizers, when depicted in some of the Figures, are shown as an elongated cylindrically shaped object, although in practice they may have slightly different shapes.

Figure 6A:
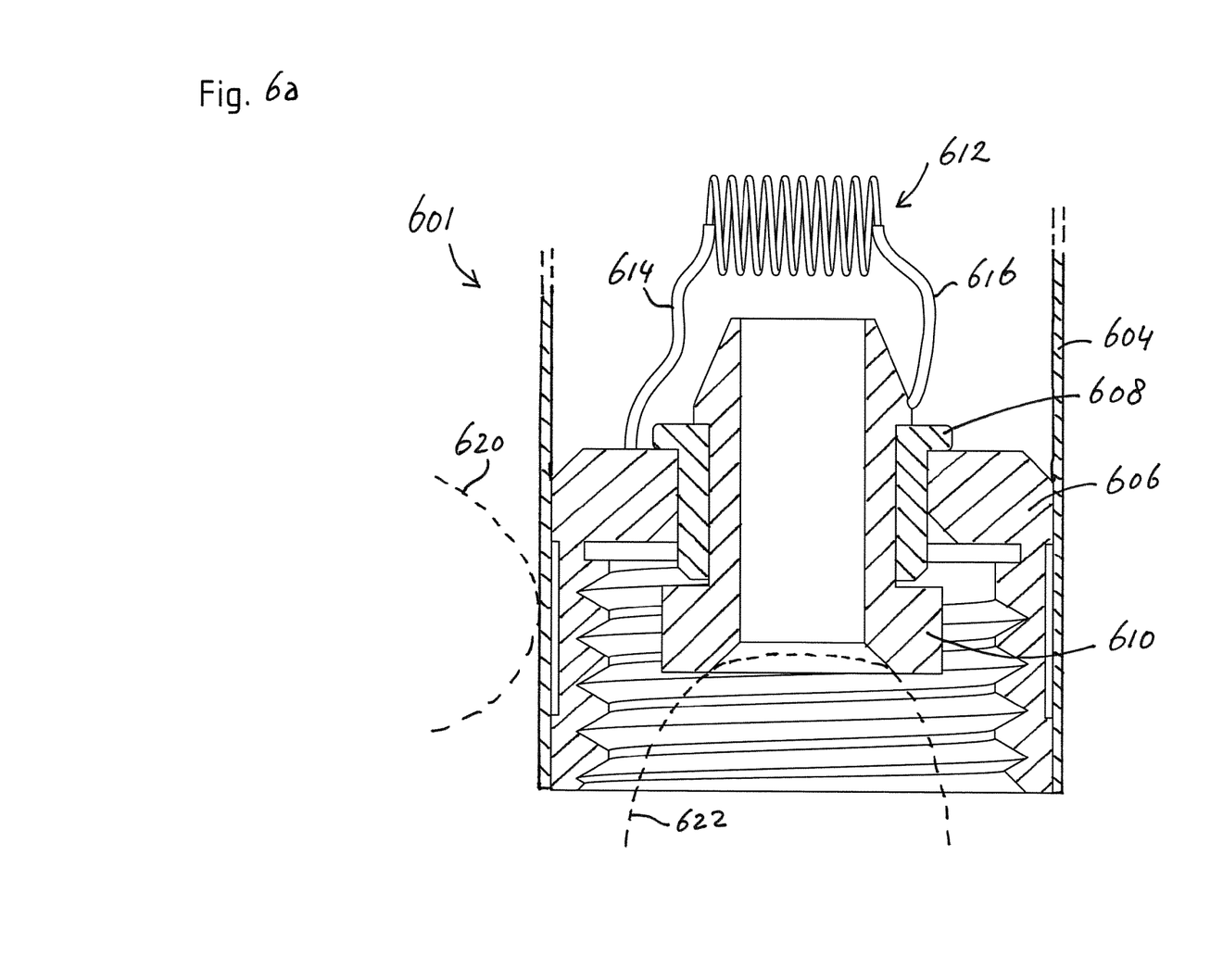
FIG. 6a schematically depicts a longitudinal cross-section of a first type of vaporizer having a first type of electric terminals for a heating element, while indicating electric contacts of contact members to electrically contact the electric terminals of the heating element.
Figure 6B:
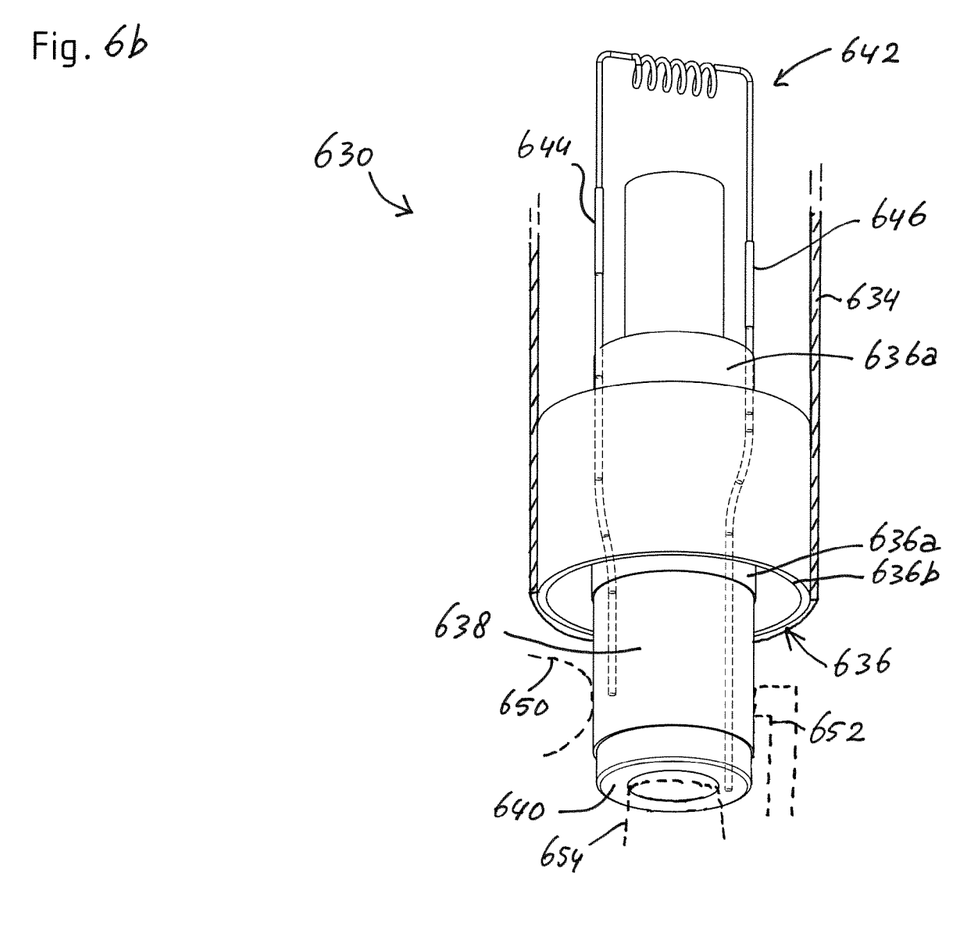
FIG. 6b schematically depicts a perspective view, partially in cross-section, of a second type of vaporizer having a second type of electric terminals for a heating element, while indicating electric contacts of contact members to electrically contact the electric terminals of the heating element.

FIGS. 6a and 6b illustrate two types of vaporizers, respectively. A first type of vaporizer, illustrated in FIG. 6a, has a first type of electric terminals for a heating element, while a second type of vaporizer, illustrated in FIG. 6b, has a second type of electric terminals for a heating element.

FIG. 6a shows a part of a vaporizer 601 comprising an essentially cylindrically shaped electrically conducting enclosure 604. In the enclosure 604, an electrically conducting first insert 606 is provided, having an inner thread along part of its axial length. The first insert 606 electrically contacts the enclosure 604. At one axial end of the first insert 606, a hole is provided in which a second electrically isolating insert 608 has been placed. A collar of the second insert 608 rests on an end face of the first insert 606. In the second insert, a third electrically conducting insert 610 has been placed having a through hole.

Within the enclosure 604, a heating element 612 is arranged. The heating element 612 is made of an electrically conducting wire, partly wound to a coil, and having a first terminal in a first electrically isolating envelope 614, and a second terminal in a second electrically isolating envelope 616. The first terminal of the wire of the heating element 612 is electrically connected to the first insert 606. The second terminal of the wire of the heating element 612 is electrically connected to the third insert 610. The first envelope 614 prevents the wire of the heating element 612 to contact the third insert 610, while the second envelope 616 prevents the wire of the heating element 612 to contact the enclosure 604 or the first insert 606.

As schematically illustrated in FIG. 6a by dashed lines, a first electric contact 620 may contact the enclosure 604 (which acts as a first electric terminal of the heating element 612), and a second electric contact 622 may contact the third insert 610 (which acts as a second electric terminal of the heating element 612). The first electric contact 620 and the second electric contact 622 may have different shapes. The first electric contact 620 may be electrically connected to mass of a testing apparatus (see e.g. mass connection 51 in FIGS. 3 and 4) and supported thereon, or may be supported on a contact member of the testing apparatus. The second electric contact 622 may be supported on a contact member of the testing apparatus.

Through the first and second electric contacts 620, 622, a voltage may be applied across the heating element 612, which will lead to a current flowing in the heating element 612, from first electric contact 620 flowing to first insert 606 to the first terminal of the heating element 612, and from the second terminal of the heating element 612 to the third insert 610 to the second electric contact 622. The first and second electric contacts 620, 622 may also be used to provide a current flowing in the heating element 612, which will lead to a voltage across the heating element 612.

FIG. 6b shows a part of a vaporizer 630 comprising an essentially cylindrically shaped electrically conducting or, preferably, isolating enclosure 634. In the enclosure 634, an electrically isolating support 636 is provided, having an inner cylindrically shaped part 636a, and an outer cylindrically shaped part 636b mechanically connected to each other. The outer part 636b is attached to the inner wall of the enclosure 634. The inner part 636a is provided with an electrically conducting cylinder 638. The inner part 636a further is provided with an electrically conducting ring 640. The inner part 636a is provided with a through hole.

Within the enclosure 634, a heating element 642 is arranged. The heating element 642 is made of an electrically conducting wire, partly wound to a coil, and having a first terminal in a first electrically isolating envelope 644, and a second terminal in a second electrically isolating envelope 646. The first terminal of the wire of the heating element 642 is electrically connected to the cylinder 638. The second terminal of the wire of the heating element 642 is electrically connected to the ring 640. The first envelope 644 prevents the wire of the heating element 642 to contact the ring 640 and/or the enclosure 634, while the second envelope 646 prevents the wire of the heating element 642 to contact the cylinder 638 and/or the enclosure 634.

As schematically illustrated in FIG. 6b by dashed lines, a first electric contact 650 or 652 may contact cylinder 638 (which acts as a first electric terminal of the heating element 642), and a second electric contact 654 may contact ring 640 (which acts as a second electric terminal of the heating element 642). The first electric contact 650, 652 and the second electric contact 654 may have different shapes. The first electric contact 650, 652 may be electrically connected to mass of a testing apparatus (see e.g. mass connection 51 in FIGS. 3 and 4) and supported thereon, or may be supported on a contact member of the testing apparatus. The second electric contact 654 may be supported on a contact member of the testing apparatus.

Through the first and second electric contacts 650, 652, 654, a voltage may be applied across the heating element 642, which will lead to a current flowing in the heating element 642, from first electric contact 650, 652 flowing to the cylinder 638 to the first terminal of the heating element 642, and from the second terminal of the heating element 642 to the ring 640 to the second electric contact 654. The first and second electric contacts 650, 652, 654 may also be used to provide a current flowing in the heating element 642, which will lead to a voltage across the heating element 642.

FIGS. 1, 2, 3 and 4 show various aspects of a testing apparatus 1. The testing apparatus 1 may have a frame plate 2 for mounting different parts. A supply unit 4 has vaporizers 6 placed in holding units 8, and places the vaporizers 6 in holding units 10 of a holding construction part 12 at a receiving location along a holding unit trajectory of the holding construction part 12 so that the vaporizers 6 are transported along at least part of the holding unit trajectory. A discharge unit 14 removes the vaporizers 6 from the holding units 10 at a discharge location located on the holding unit trajectory of the holding construction part 12, and takes the vaporizers in holding units 16. A transport unit 18 removes the vaporizers 6 from the holding units 16 of the discharge unit 14 into holding units 20 of the transport unit 18 for further transport.

The supply unit 4, the holding construction part 12, the discharge unit 14, and the transport unit 18 each comprise a rotary wheel 5, 13, 15, 19, respectively having a peripheral surface provided with recesses forming the holding units 8, 10, 16 and 20, respectively. In the embodiment shown, the holding units 8, 10, 16 and 20 clampingly engage the vaporizers 6. In other embodiments, other types of holding units may be employed, engaging the vaporizers 6 e.g. by activatable mechanical grippers, by suction, etc. Holding units 8, 10, 16 and 20 together with guides 21, 23, 25, respectively, detain the vaporizers 6 along a path of conveyance. The rotary wheels 5, 13, 15, 19 of supply unit 4, holding construction part 12, discharge unit 14, and transport unit 18 comprise a central axis 22, 24, 26, 28 around which they are configured to rotate in a direction of arrows 30, 32, 34, 36, respectively. One or more of the rotary wheels 5, 13, 15, 19 may be driven by a drive (not shown) and/or be mechanically coupled (not shown) by gear wheels to one or more of the other wheels for rotating in synchronism, so that vaporizers 6 may be transferred from a holding unit 8 to a holding unit 10, from a holding unit 10 to a holding unit 16, and from a holding unit 16 to a holding unit 20, at a point where the respective holding units face each other. The rotation of the rotary wheels 5, 13, 15, 19 can be continuous, at varying or fixed speed, or can be intermittent.

Figure 1:
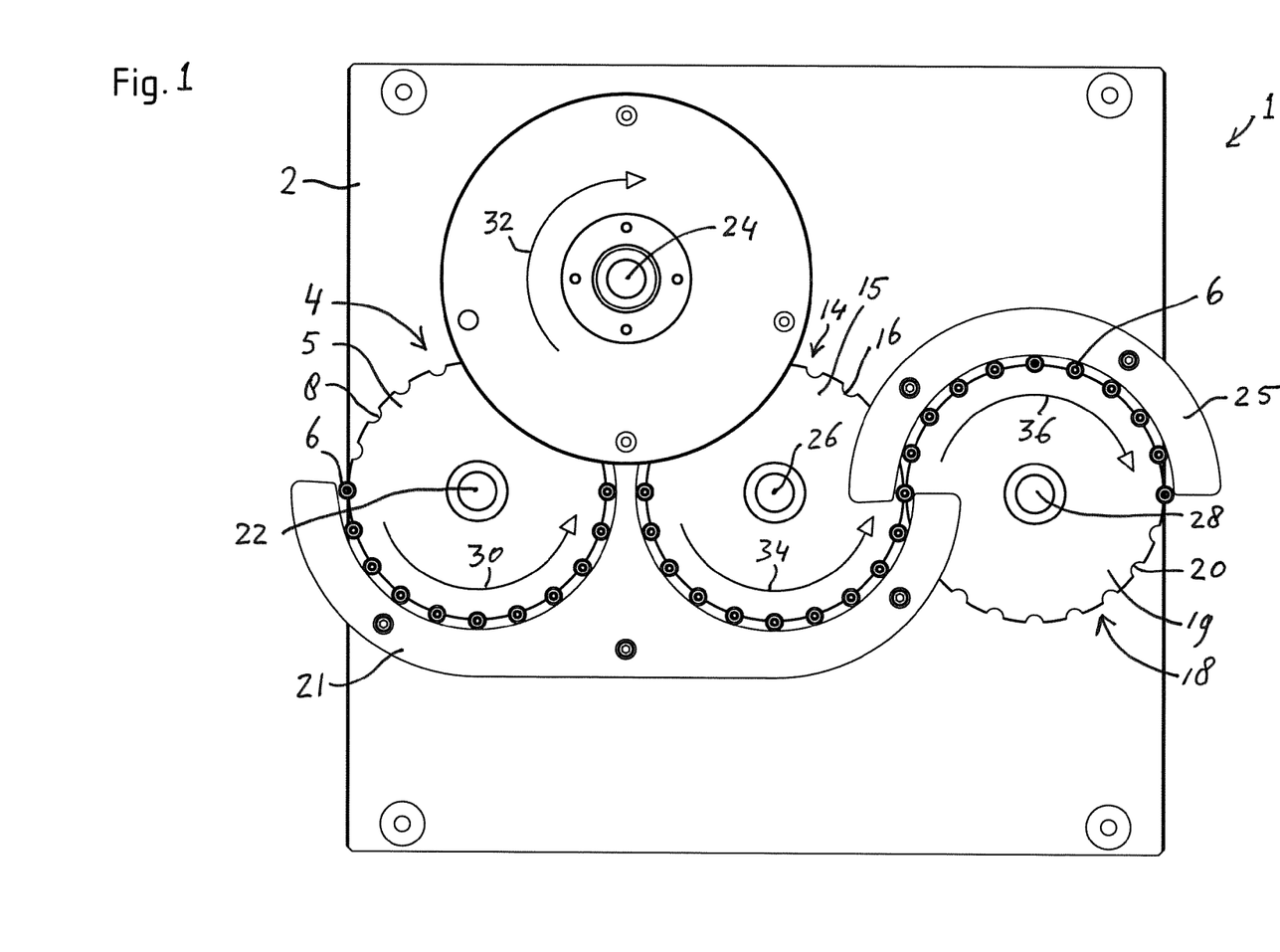
FIG. 1 schematically depicts a top view of an embodiment of a testing apparatus according to the invention, including a supply unit and a discharge unit, the testing apparatus carrying a plurality of vaporizers.
Figure 2:
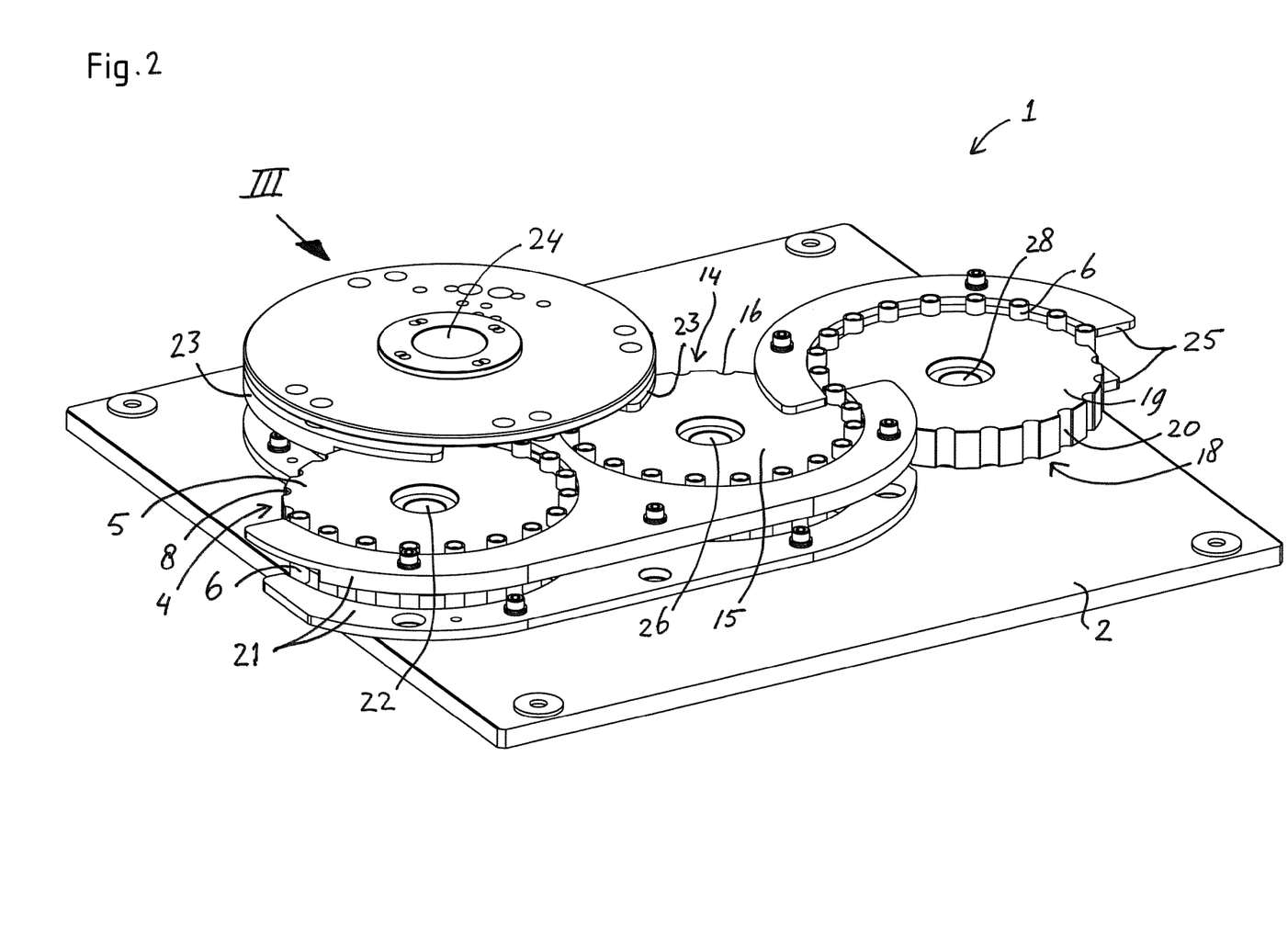
FIG. 2 schematically depicts a perspective view of the embodiment of the testing apparatus of FIG. 1.
Figure 3:
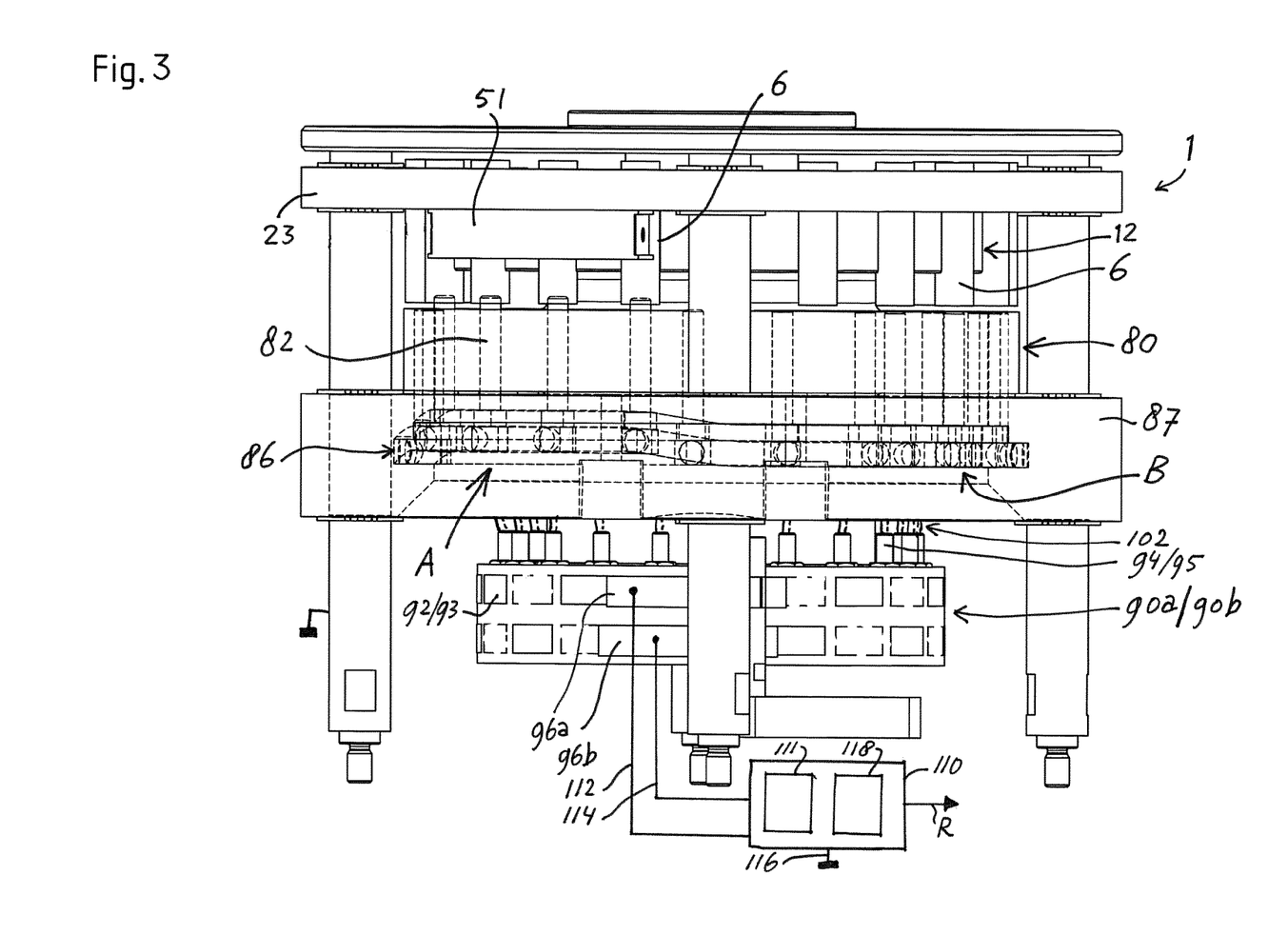
FIG. 3 schematically depicts a side view, taken in a direction III as indicated in FIG. 2, of an embodiment of a testing apparatus according to the invention, partially in diagram, the testing apparatus carrying a plurality of vaporizers.
Figure 4:
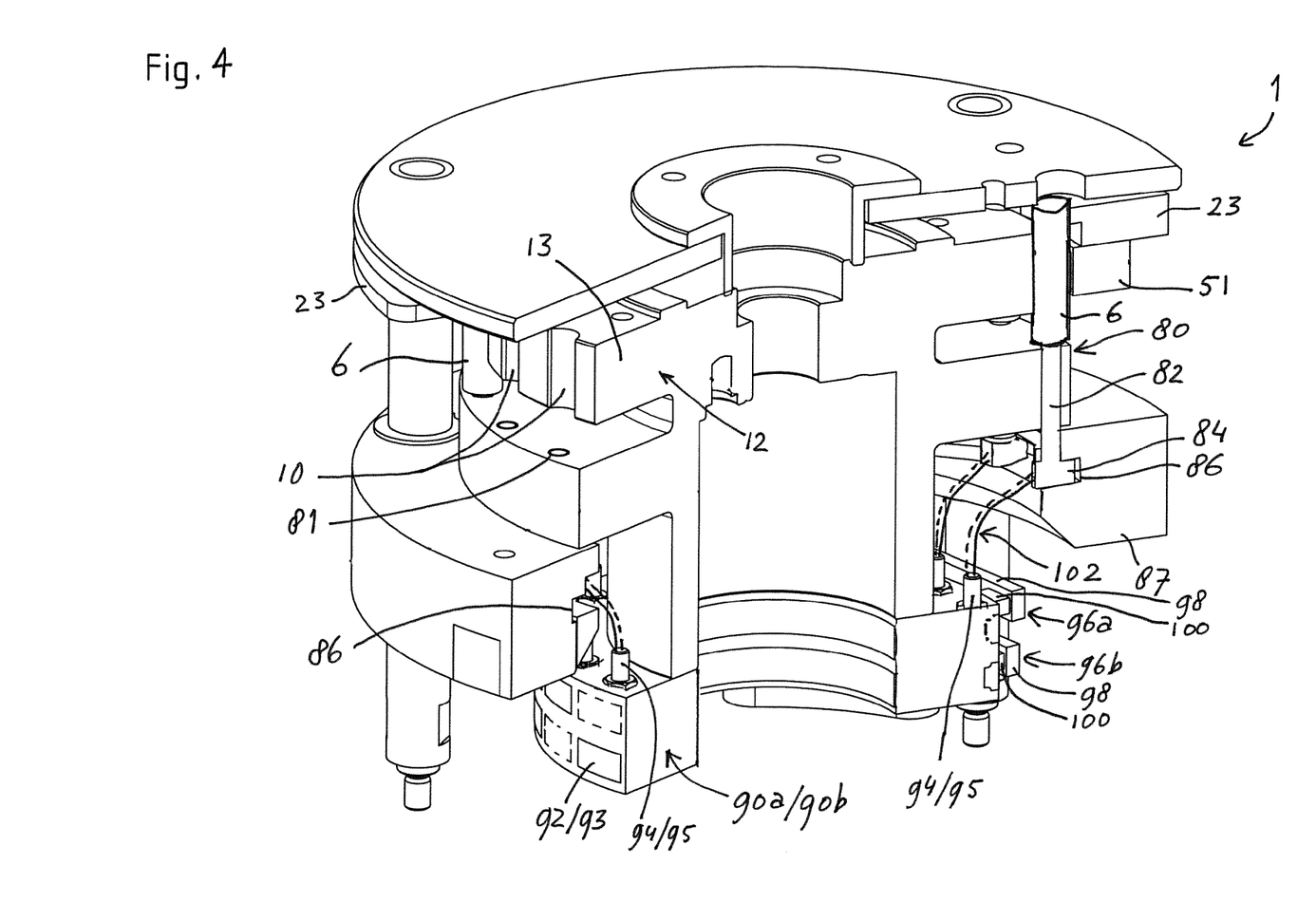
FIG. 4 schematically depicts a perspective view, partially cut away, of the embodiment of the testing apparatus of FIG. 3, again partly in diagram, with no vaporizers accommodated in holding units of a holding construction part at the left-hand part of FIG. 4, and a vaporizer accommodated in a holding unit of the holding construction part at the right-hand part of FIG. 4.

Referring in particular to FIGS. 3 and 4, the testing apparatus 1 further comprises an essentially ring-shaped contact construction part 80 provided with multiple electrical contact members 82, wherein each contact member 82 is associated with a respective holding unit 10 of the holding construction part 12, and is configured to contact at least one electric terminal of a vaporizer 6 in the associated holding unit 10. In the embodiment shown, the contact construction part 80 is fixed to the holding construction part 12 to be moved in rotation and in synchronism therewith.

Each contact member 82 is configured to be displaced between a first position in which the contact member contacts at least one electric terminal of a vaporizer 6 in the associated holding unit 10, and a second position in which the contact member 82 does not contact an electric terminal of the vaporizer 6 in the associated holding unit 10. In particular, each contact member 82 comprises a cam track follower 84, and upon movement of the contact construction part 80 the contact members 82 are positioned in and between the first position and the second position thereof by a stationary cam track 86 in a cam track part 87, in particular from the first position to the second position thereof, and from the second position to the first position thereof. The cam track 86 engages the cam track followers 84 of the contact members 82, wherein the cam track followers 84 move relative to the cam track 86, and the contact members 82 slide in channels 81 provided in the contact construction part 80.

As is shown in particular in FIG. 3, the cam track 86 comprises a sectional part A bringing the contact members 82 by displacement of their cam track followers 84 to the first position thereof to contact at least one electric terminal of the vaporizers 6 held in the associated holding units 10. In a sectional part B of the cam track 86, the contact members 82 by displacement of their cam track followers 84, are brought to the second position thereof to have no contact with an electric terminal of the vaporizers 6 held in the associated holding units 10.

Figure 5A:
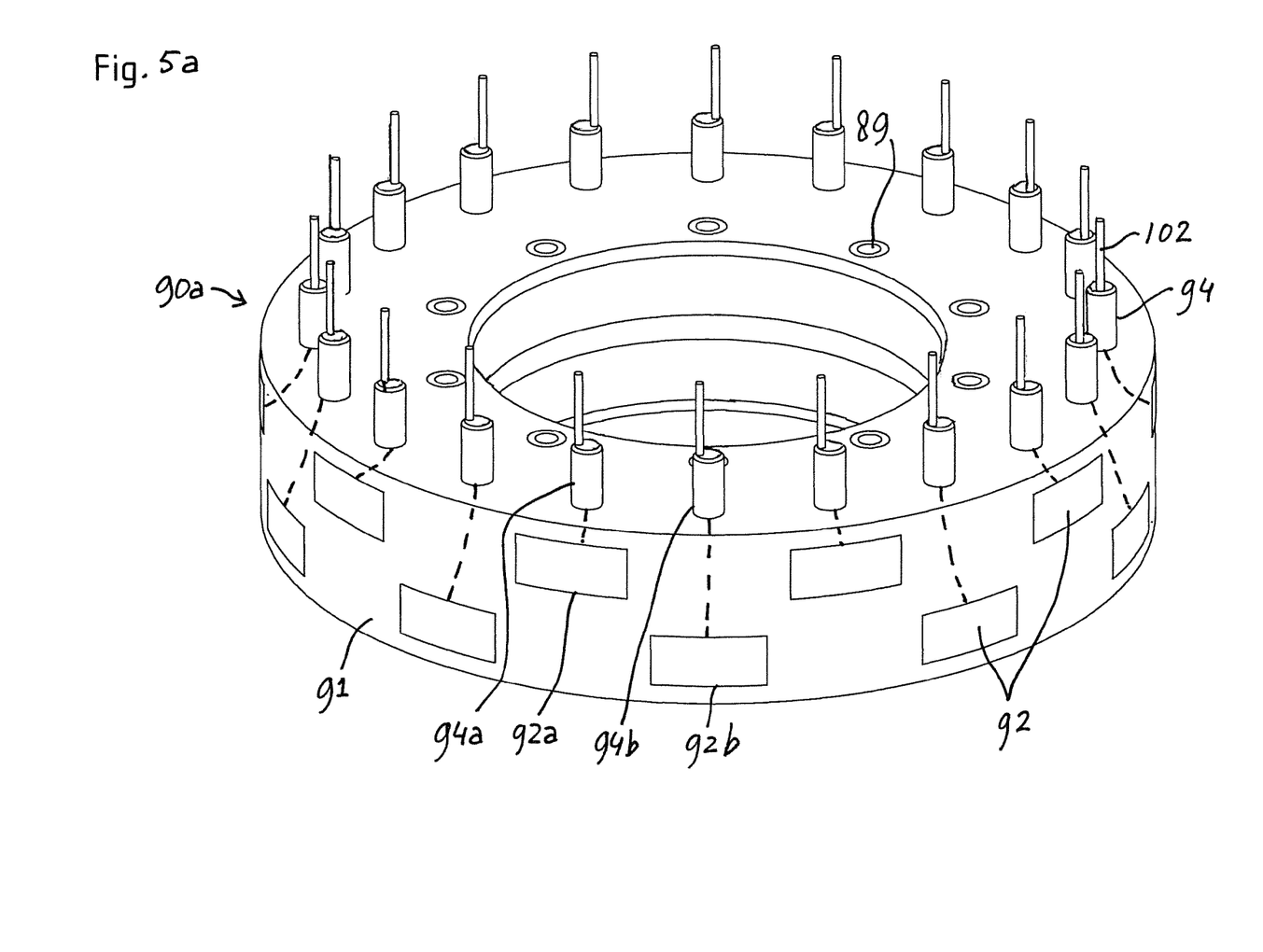
FIGS. 5a and 5b each schematically depict a perspective view of a different embodiment of a supply construction part of the testing apparatus of FIG. 3 or 4.
Figure 5B:
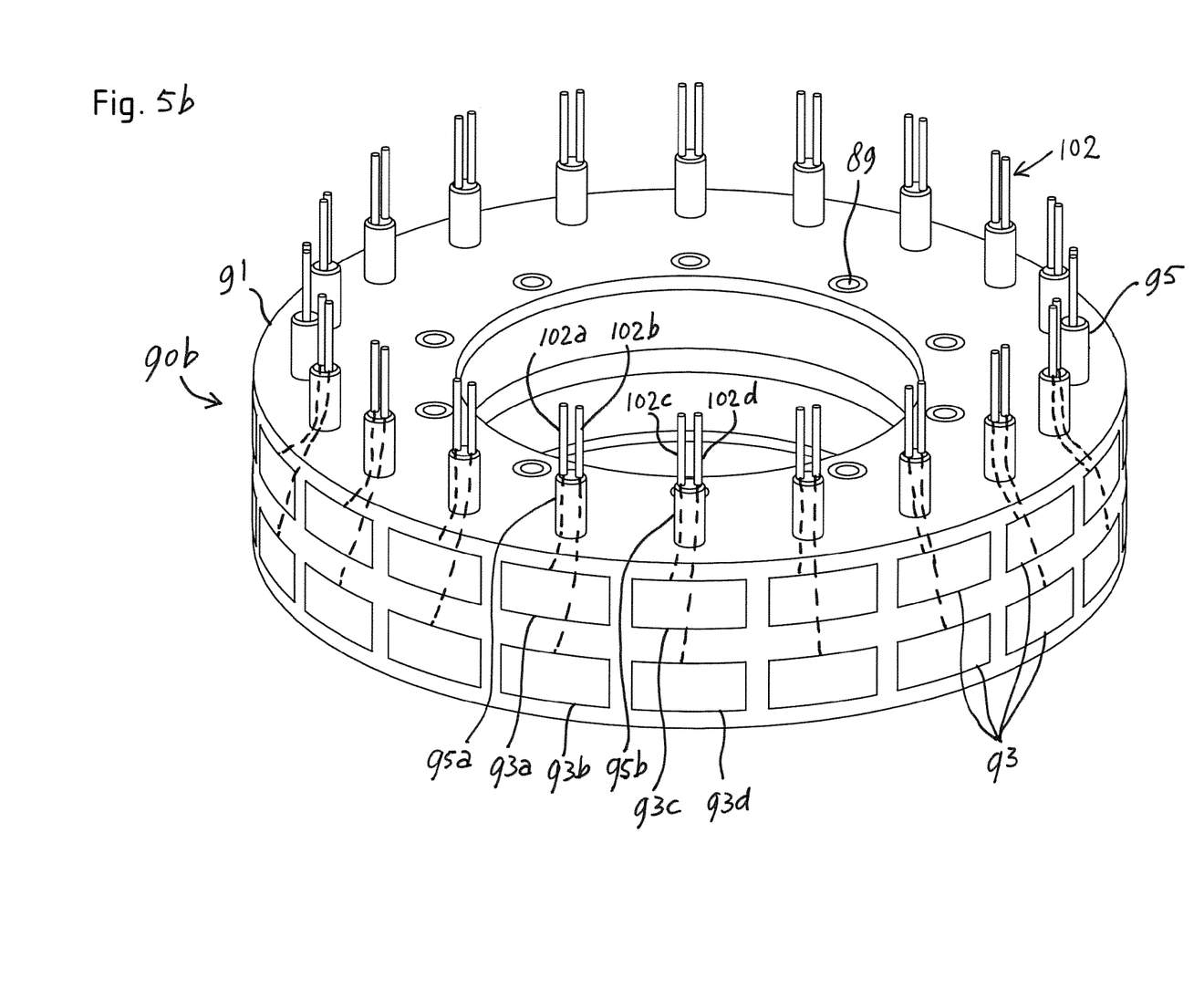

In the testing apparatus 1, a first supply construction part 90a, shown in FIG. 5a, or a second supply construction part 90b, shown in FIG. 5b, may be included. These supply construction parts illustrate basic variants which may be embodied in other forms, based on the same principles of operation.

Referring to FIGS. 3, 4, and the embodiment of FIG. 5a, in the testing apparatus 1 an essentially ring-shaped first supply construction part 90a may be provided. The first supply construction part 90a is adapted to be moved, in particular to be rotated, in synchronism with the contact construction part 80. For this purpose, the first supply construction part 90a may be fixed to the contact construction part 80 by bolts (not shown) passing through holes 89.

At an outer side thereof, the first supply construction part 90a is provided with multiple electric slip contacts 92 mounted in an electrically isolating body 91. Each slip contact 92 is electrically connected to an electrically conducting wire 102 through an associated electrically conducting pin 94 mounted in the electrically isolating body 91 of the first supply construction part 90a, and such electric connection is symbolically indicated by a dashed line in FIG. 5a. For illustration, slip contact 92a is electrically connected to pin 94a, and slip contact 92b is electrically connected to pin 94b. Every other one of the slip contacts 92, as seen along the circumference of the first supply construction part 90a, is located in a lower or higher part, respectively, of the outer side of the first supply construction part 90a.

Embodied in another form (not shown), and based on the same principle of operation, instead of having slip contacts 92 alternatingly located in a lower or higher part of the first supply construction part 90a, the slip contacts 92 may be located in a row along the circumference of the body 91.

Referring to FIGS. 3, 4, and the embodiment of FIG. 5b, in the testing apparatus 1 an essentially ring-shaped second supply construction part 90b may be provided. The second supply construction part 90b is adapted to be moved, in particular to be rotated, in synchronism with the contact construction part 80. For this purpose, the second supply construction part 90b may be fixed to the contact construction part 80 by bolts (not shown) passing through holes 89.

At an outer side thereof, the second supply construction part 90b is provided with multiple electric slip contacts 93 mounted in an electrically isolating body 91. Each slip contact 93 is electrically connected to an electrically conducting wire 102 via an associated electrically isolating pin 95 mounted on the electrically isolating body 91 of the second supply construction part 90b, and such electric connections are symbolically indicated by a dashed line in FIG. 5b. As can be seen, slip contacts 93a, 93b, where slip contact 93a is located above slip contact 93b, are electrically connected to electrically conducting wires 102a, 102b, respectively, via associated pin 95a. Slip contacts 93c, 93d, where slip contact 93c is located above slip contact 93d, are electrically connected to electrically conducting wires 102c, 102d, respectively, via associated pin 95b. Slip contacts 93 are arranged in two rows along the circumference of the second supply construction part 90b, one row in a higher part, and one row in a lower part of the outer side of the second supply construction part 90b.

As shown in FIGS. 3 and 4, two stationary power electric terminals 96a, 96b are arranged and configured to electrically contact and power slip contacts 92, 93, depending on use of the first supply construction part 90a or second supply construction part 90b, respectively. The power electric terminals 96a, 96b each comprise an electrically conducting arm 98 and an electrically conducting pad 100. The arms 98 are biased, e.g. spring-biased, towards the first supply construction part 90a or second supply construction part 90b, in particular towards the outer side of the first supply construction part 90a or the second supply construction part 90b carrying the electric slip contacts 92 or 93, respectively. Upon rotation of the first supply construction part 90a or the second supply construction part 90b, the pad 100 of power electric terminal 96a is to contact different slip contacts 92 or 93, respectively, in a higher part of the outer side of first supply construction part 90a or the second supply construction part 90b, while the pad 100 of power electric terminal 96b is to contact different slip contacts 92 or 93, respectively, in a lower part of the outer side of the first supply construction part 90a or the second supply construction part 90b.

In case the testing apparatus 1 comprises the first supply construction part 90a, each slip contact 92 is electrically connected to an electric contact, such as electric contact 622 (FIG. 6a) of an associated contact member 82 through an associated pin 94 and flexible wire 102.

In case the testing apparatus 1 comprises the second supply construction part 90b, pairs of slip contacts 93 arranged one above the other, such as pair of slip contacts 93a, 93b and pair of slip contacts 93c, 93d, are electrically connected to electric contacts, such as electric contacts 620, 622 (FIG. 6a) or electric contacts 650, 654 (FIG. 6b) or electric contacts 652, 654 (FIG. 6b) of an associated contact member 82 through a pair of flexible wires 102.

In case the testing apparatus 1 comprises a first supply construction part 90a, the location of the power electric terminals 96a, 96b, in particular of the pads 100 thereof, is selected such that the power electric terminals 96a, 96b mechanically and electrically contact a slip contact 92 associated with a pin 94, and a flexible wire 102 connected to an associated contact member 82, which in turn is associated with a holding unit 10, when the contact member 82 by displacement of its cam track follower 84 to the first position thereof contacts an electric terminal of a vaporizer 6 held in the associated holding unit 10.

First supply construction part 90a is adapted to be used when it suffices for the electric contact, such as electric contact 622 (FIG. 6a) or electric contact 654 (FIG. 6b) of contact member 82 to electrically contact only one electric terminal, such as third insert 610 (FIG. 6a) or ring 640 (FIG. 6b), of a heating element of vaporizer 6, whereas another electric terminal of the heating element, such as enclosure 604 (FIG. 6a) or cylinder 638 (FIG. 6b), is electrically contacted by an electric contact, such as electric contact 620 (FIG. 6a) or electric contact 650 or 652 (FIG. 6b), being in electric contact with a conducting mass of the testing apparatus 1.

In case the testing apparatus 1 comprises a second supply construction part 90b, the location of the power electric terminals 96a, 96b, in particular of the pads 100 thereof, is selected such that the power electric terminals 96a, 96b each mechanically and electrically contact a slip contact 93 associated with a pin 95, and flexible wires 102 connected to electrical contacts of an associated contact member 82, which in turn is associated with a holding unit 10, when the contact member 82 by displacement of its cam track follower 84 to the first position thereof contacts two electric terminals of a vaporizer 6 held in the associated holding unit 10.

Second supply construction part 90b is adapted to be used when the electric contacts, such as electric contacts 620, 622 (FIG. 6a) or electric contacts 650, 654 (FIG. 6b) or electric contacts 652, 654 (FIG. 6b), of contact member 82 are to contact two electric terminals, such as third insert 610 and enclosure 604 (FIG. 6a) or cylinder 638 and ring 640 (FIG. 6b) of a heating element of a vaporizer 6.

FIG. 3 diagrammatically illustrates the power electric terminals 96a, 96b being connected to a measuring part 110 by a first line 112 and a second line 114, respectively. The measuring part 110 further comprises an electrical connection 51 to mass of the testing apparatus 1 by a third line 116. The measuring part 110 further comprises a power supply 111.

In case the testing apparatus 1 comprises a first supply construction part 90a, the power supply 111 may be adapted to apply a DC or AC voltage, or a predetermined DC or AC voltage, between first line 112 to power electric terminal 96a and third line 116 to mass of the testing apparatus 1, and to apply the same DC or AC voltage, or the same predetermined DC or AC voltage, between second line 114 to power electric terminal 96b and third line 116 to mass of the testing apparatus 1. Upon rotation of the first supply construction part 90a, alternatingly (a pad 100 of) the power electric terminal 96a will power a slip contact 92, such as slip contact 92a, in a higher part of the outer side of first supply construction part 90a, and (a pad 100 of) the power electric terminal 96b will power a slip contact 92, such as slip contact 92b, in a lower part of the outer side of the first supply construction part 90a. Instead of applying a DC or AC voltage across first line 112 and third line 116, and across second line 114 and third line 116, the power supply 111 may be adapted to supply a DC or AC current, or a predetermined DC or AC current, through first and third lines 112, 116 and through second and third lines 114, 116, when the contact member 82 electrically contacts an electric terminal of a heating element of a vaporizer 6, whereas another electric terminal of the heating element electrically contacts the mass of the testing apparatus 1.

In case the testing apparatus 1 comprises a second supply construction part 90b, the power supply 111 may be adapted to apply a DC or AC voltage, or a predetermined DC or AC voltage, between first line 112 to power electric terminal 96a and second line 114 to power electric terminal 96b of the testing apparatus 1. Upon rotation of the first supply construction part 90a, (the pads 100 of) the power electric terminals 96a, 96b will power subsequent pairs of slip contacts 93, located one above the other such as slip contacts 93a, 93b, or slip contacts 93c, 93d. Instead of applying a DC or AC voltage across first line 112 and second line 114, the power supply 111 may be adapted to supply a DC or AC current, or a predetermined DC or AC current, through first and second lines 112, 114, when the electric contacts of contact member 82 contacts the electric terminals of a heating element of a vaporizer 6.

It is noted that the power supply 111 may, instead of being included in the measuring part 110, also be external to the measuring part 110, but performing the same function as described above. The measuring part 110 may be adapted and configured to control a setting of the power supply 111 to apply a (possibly predetermined) DC or AC voltage, or to apply a (possibly predetermined) DC or AC current.

The measuring part 110 is adapted to measure at least one electric quantity representative of an electric resistance and/or inductance of a heating element of a vaporizer 6 being tested when the power electric terminals 96a, 96b contact a slip contact 92 or slip contacts 93 associated with a contact member 82 associated with a holding unit 10 holding the vaporizer 6.

The measuring part 110 comprises a comparing unit 118 configured to compare the measured quantity with a predetermined range and, if the measured quantity is outside the range, output a rejection signal R. The rejection signal R can be supplied to a testing apparatus control device to control an ejection of the associated vaporizer 6 at a location.

Next, the operation of the testing apparatus 1 will be described and explained in further detail.

In operation, vaporizers 6 are supplied to holding units 10 by the supply unit 4 at a receiving location along a holding unit trajectory of the holding construction part 12 so that the vaporizers 6 are transported along at least part of the holding unit trajectory. Considering the direction of rotation 32 of the holding construction part 12, the receiving location is associated with a sectional part B of the cam track 86, upstream of the sectional part A of cam track 86.

For each vaporizer 6 to be tested and held in a holding unit 10, when the cam track follower 84 of the associated contact member 82 is in the sectional part B outside the sectional part A of cam track 86, the vaporizer 6 is not electrically powered, so no current flows in the heating element of the vaporizer.

For each vaporizer 6 held in a holding unit 10, when the cam track follower 84 of the associated contact member 82 enters the sectional part A of cam track 86, the contact member 82 is displaced towards the vaporizer 6 by the cam track follower 84 being displaced in the cam track 86. By such displacement, the contact member 82 mechanically and electrically contacts at least one electric terminal of the heating element of the vaporizer 6. As explained above, in case of a first supply construction part 90a in the testing apparatus 1, another electric terminal of the heating element of the vaporizer 6 may mechanically and electrically contact a part of the holding unit 10 electrically connected to mass. In case of a second supply construction part 90b in the testing apparatus 1, a connection to mass is not necessary, and both electric terminals of the heating element of the vaporizer 6 may mechanically and electrically contact an electric contact of the contact member 82.

Next, for each vaporizer 6 held in a holding unit 10, the slip contact 92 (in case of first supply construction part 90a) or slip contacts 93 (in case of second supply construction part 90b) that is/are mechanically and electrically connected through pin 94 or 95 and wire(s) 102 to the electric terminal(s) of the heating element of the vaporizer 6, is/are powered by the power supply 111 through one or both of the power electric terminals 96a, 96b, at most during a time that the pad(s) 100 of the power electric terminal(s) 96a, 96b contact(s) the slip contact 92 or slip contacts 93, or during a shorter period of time. As a result, the electric contact(s) of the contact member 82 electrically power(s) the electric terminal(s) of the heating element of the vaporizer 6.

During this powering of the electric terminals of the heating element of the vaporizer 6, the power supply 111 may apply a predetermined DC or AC voltage to the electric terminals of the heating element, while the measuring part 110 measures a DC current or AC current, respectively, flowing through the heating element. Here, the DC or AC current is an electric quantity representative of an electric resistance and/or inductance of the heating element.

Alternatively, the power supply 111 may supply a predetermined DC or AC current flowing through the heating element, while the measuring part 110 measures a DC or AC voltage, respectively, at the electric terminals of the heating element. Here, the DC or AC voltage is an electric quantity representative of an electric resistance and/or inductance of the heating element.

The power supply 111 may also apply a non-predetermined DC or AC voltage to the electric terminals of the heating element, while the measuring part 110 measures a DC or AC current, respectively, flowing through the heating element. Here, dividing the voltage by the current provides an electric quantity representative of an electric resistance and/or inductance of the heating element.

The power supply 111 may also supply a non-predetermined DC or AC current to the electric terminals of the heating element, while the measuring part 110 measures a DC or AC voltage, respectively, at the electric terminals of the heating element. Here, dividing the voltage by the current provides an electric quantity representative of an electric resistance and/or inductance of the heating element.

If the heating element of the vaporizer 6 is fully functional, the electric powering of the electric terminals of the heating element of the vaporizer 6 causes the measuring part 110 to determine an electric quantity representative of the electric resistance and/or inductance of the heating element. The comparing unit 118 of the measuring part 110 compares the measured quantity with a predetermined range and, if the measured quantity is outside the range, outputs a rejection signal R.

If the heating element of the vaporizer 6 is malfunctioning, e.g. because of a broken heating element, or a connection between an electric terminal and the heating element being broken or otherwise ill-produced, or a deformation of the heating element, then the electric powering of the electric terminals does not lead to the measured quantity being in the predetermined range, and the rejection signal R is output.

The measured quantity may be representative of an electric resistance, in particular under DC conditions, but also under relatively low frequency AC conditions. The measured quantity may also indicate inductance, in particular under high frequency AC conditions. If necessary, also the frequency of the AC voltage or AC current, and/or the phase shift between the AC voltage and the AC current, and/or a time constant of a DC voltage or DC current may be measured for determining inductance or impedance comprising a resistive and inductive component.

In a practical measurement, the heating element of a vaporizer 6 may be tested in the testing apparatus 1 in a testing period of less than 250 ms with a predetermined DC current of 45 mA. The measuring part may have a sampling frequency, in particular a sampling frequency of 50 Hz, so that during the testing period several tests can be made, and test results can be averaged to improve the reliability of the testing. As a measured quantity, a voltage range 0.16-0.17 V may be determined for acceptable heating element impedances of about 3.6-3.8Ω.

After testing a heating element of a vaporizer 6, the cam track follower 84 of the associated contact member 82 moves from sectional part A of cam track 86 to sectional part B of cam track 86, whereby the contact member 82 is displaced away from the electric terminal(s) of the vaporizer 6 by its cam track follower 84 being displaced in the cam track 86. The tested vaporizer 6 is removed from the holding unit 10 at the discharge location of the holding unit trajectory.

As explained in detail above, a testing apparatus for testing vaporizers of electronic cigarettes is disclosed. Each vaporizer comprises a heating element, and electric terminals connected to the heating element for electrically powering the heating element. The testing apparatus comprises a holding construction part provided with multiple holding units each for holding a vaporizer. The holding units are movable along a holding unit trajectory. A contact construction part is provided with multiple electric contact members. Each contact member is associated with a respective holding unit, and electrically contacts at least one electric terminal of a vaporizer in the associated holding unit. A supply construction part conducts electric power to each contact member. A measuring part measures at least one electric quantity representative of an electric resistance and/or inductance of the heating element, compares the measured quantity with a predetermined range and, if the measured quantity is outside the range, outputs a rejection signal.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting, but rather, to provide an understandable description of the invention.

The terms "a"/"an", as used herein, are defined as one or more than one. The term plurality, as used herein, is defined as two or more than two. The term another, as used herein, is defined as at least a second or more. The terms including and/or having, as used herein, are defined as comprising (i.e., open language, not excluding other elements or steps). Any reference signs in the claims should not be construed as limiting the scope of the claims or the invention.

The mere fact that certain measures are recited in mutually different dependent claims does not indicate that a combination of these measures cannot be used to advantage.

The invention claimed is:

1. A testing apparatus for testing vaporizers of electronic cigarettes, each vaporizer comprising a heating element, and electric terminals connected to the heating element for electrically powering the heating element, the testing apparatus comprising:
   a holding construction part provided with multiple holding units each for holding a vaporizer, wherein the holding construction part is movable whereby the holding units are moved along a holding unit trajectory;
   a contact construction part provided with multiple electric contact members, wherein each electric contact member of the multiple electric contact members is associated with a respective different holding unit of the multiple holding units, and is configured to electrically contact at least one electric terminal of a vaporizer in the associated respective different holding unit;
   a supply construction part configured to conduct electric power to each electric contact member; and
   a measuring part configured to measure at least one electric quantity representative of an electric resistance and/or inductance of the heating element.

2. The testing apparatus according to claim 1, wherein the measuring part is configured for:
   measuring a DC current flowing through the heating element while applying a predetermined DC voltage to the electric terminals of the heating element, or
   measuring a DC voltage at the electric terminals of the heating element while supplying a predetermined DC current flowing through the heating element, or
   measuring a DC voltage at the electric terminals of the heating element and measuring a DC current flowing through the heating element, or
   measuring an AC current flowing through the heating element while applying a predetermined AC voltage to the electric terminals of the heating element, or
   measuring an AC voltage at the electric terminals of the heating element while supplying a predetermined AC current flowing through the heating element, or
   measuring an AC voltage at the electric terminals of the heating element and measuring an AC current flowing through the heating element.

3. The testing apparatus according to claim 2, wherein the measuring part further is configured to measure:
   a frequency of the AC voltage or the AC current; and/or
   a phase shift between the AC voltage and the AC current; and/or
   a time constant of the DC current or the DC voltage.

4. The testing apparatus according to claim 1, wherein the measuring part further is configured to:
   compare the measured quantity with a predetermined range and, if the measured quantity is outside the predetermined range, output a rejection signal.

5. The testing apparatus according to claim 1, wherein the supply construction part comprises:
   multiple electric slip contacts, wherein each slip contact is associated with, and electrically connected to, a respective electric contact member, and wherein the supply construction part is adapted to be moved in synchronism with the contact construction part; and
   at least one power electric terminal configured to electrically contact slip contacts for conducting electric power to the slip contacts, wherein the slip contacts are adapted to move relative to the power electric terminal.

6. The testing apparatus according to claim 5, wherein the power electric terminal is stationary.

7. The testing apparatus according to claim 1, wherein each electric contact member is configured to be displaced between a first position in which the electric contact member contacts at least one electric terminal of a vaporizer in the associated holding unit, and a second position in which the electric contact member does not contact an electric terminal of the vaporizer in the associated holding unit, wherein two or more electric contact members of the multiple electric contact members are each configured to electrically contact a single respective different vaporizer at the same time.

8. The testing apparatus according to claim 7, wherein each electric contact member comprises a cam track follower, and wherein upon movement of the contact construction part the electric contact members are positioned in and between the first position and the second position by a cam track engaging the cam track followers of the electric contact members, wherein the cam track followers are moved relative to the cam track while moving along a part of the cam track.

9. The testing apparatus according to claim 8, wherein the cam track is stationary.

10. The testing apparatus according to claim 1, wherein the holding units form a circular configuration, and wherein the holding construction part is movable in rotation whereby the holding units are moved in a rotation direction.

11. The testing apparatus according to claim 10, wherein the contact construction part is fixed to the holding construction part to be moved in rotation therewith.

12. The testing apparatus according to claim 1, further comprising:
   a supply unit configured to place the vaporizers in the holding units of the holding construction part at a receiving location along the holding unit trajectory so that the vaporizers are transported along at least part of the holding unit trajectory; and
   a discharge unit configured to remove the vaporizers from the holding units at a discharge location along the holding unit trajectory.

13. The testing apparatus according to claim 1, wherein the contact construction part is adapted to move in synchronism with the holding construction part.

14. The testing apparatus according to claim 1, wherein the contact construction part is fixed to the holding construction part.

15. The testing apparatus according to claim 1, wherein:
   the contact construction part and the holding construction part are each part of a rotary wheel;
   the multiple holding units comprise a plurality of recesses formed in a peripheral surface of the rotary wheel; and
   each electric contact member of the multiple electric contact members is disposed at least partially through a respective different channel of multiple channels formed in the rotary wheel.

16. The testing apparatus according to claim 1, wherein each respective different channel of the multiple channels is disposed below the respective different holding unit of the multiple holding units.

17. A method of testing vaporizers for electronic cigarettes, each vaporizer comprising a heating element, and electric terminals connected to the heating element for electrically powering the heating element, the method comprising:
   electrically powering a plurality of heating elements of a plurality of vaporizers at the same time;
   measuring at least one electric quantity representative of an electric resistance and/or inductance of each of the plurality of heating elements at the same time; and
   comparing the measured quantity with a predetermined range for each of the plurality of heating elements and, if the measured quantity is outside the predetermined range for a vaporizer, then rejecting the vaporizer, the rejecting the vaporizer comprising removing the vaporizer from a production process.

* * * * *